United States Patent
Chen

(10) Patent No.: US 10,520,391 B1
(45) Date of Patent: Dec. 31, 2019

(54) OPTICAL MEASUREMENT APPARATUS

(71) Applicant: Industrial Technology Research Institute, Hsinchu (TW)

(72) Inventor: Shang-Chun Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/232,061

(22) Filed: Dec. 26, 2018

(30) Foreign Application Priority Data

Dec. 3, 2018 (TW) .............................. 107143321 A

(51) Int. Cl.
*G01M 11/02* (2006.01)
*G01M 11/00* (2006.01)
(Continued)

(52) U.S. Cl.
CPC ........ *G01M 11/0207* (2013.01); *G01M 11/33* (2013.01); *G01R 31/31728* (2013.01);
(Continued)

(58) Field of Classification Search
CPC .. G01M 11/02; G01M 11/0207; G01M 11/30; G01M 11/33; G01M 11/332; G01M 11/35; G01M 11/37; G01R 31/31728; G02B 6/10; G02B 6/12; G02B 6/12002; G02B 6/12004; G02B 6/122; G02B 6/125; G02B 6/30; G02B 6/305; H04B 10/07;
(Continued)

(56) References Cited

U.S. PATENT DOCUMENTS 6,925,238 B2 8/2005 Lee et al.
7,109,739 B2 9/2006 Gothoskar et al.
(Continued)

FOREIGN PATENT DOCUMENTS

CN 107768265 3/2018
TW 201316010 4/2013

OTHER PUBLICATIONS

T. Barwicz et al., "Assembly of Mechanically Compliant Interfaces between Optical Fibers and Nanophotonic Chips," IEEE 64th ECTC—Orlando, May 27-30, 2014, pp. 1-14.
(Continued)

*Primary Examiner* — Gordon J Stock, Jr.
(74) *Attorney, Agent, or Firm* — JCIPRNET

(57) ABSTRACT

An optical measurement apparatus configured to measure a photonic integrated circuit (photonic IC) is provided. The optical measurement apparatus includes a substrate, at least one optical waveguide device, a first connector, and a second connector. The at least one optical waveguide device is disposed on the substrate. The first connector and the second connector are connected with the at least one optical waveguide device. An optical signal from a first optical fiber is transmitted to the at least one optical waveguide device through the first connector, transmitted to the inside of the photonic IC though at least one first evanescent coupler of the photonic IC, transmitted to the at least one optical waveguide device through at least one second evanescent coupler of the photonic IC, and transmitted to a second optical fiber through the second connector in sequence.

7 Claims, 19 Drawing Sheets

(51) Int. Cl.
*G02B 6/30* (2006.01)
*G02B 6/12* (2006.01)
*G01R 31/317* (2006.01)
*H04B 10/07* (2013.01)
*H04B 10/073* (2013.01)

(52) U.S. Cl.
CPC .............. *G02B 6/12* (2013.01); *G02B 6/305* (2013.01); *H04B 10/07* (2013.01); *H04B 10/0731* (2013.01)

(58) Field of Classification Search
CPC ............. H04B 10/0705; H04B 10/071; H04B 10/073; H04B 10/0731; H04B 10/075; H04B 10/12; H04B 10/80; H04B 10/801; H04B 10/802; H04B 10/803
See application file for complete search history.

(56) References Cited

U.S. PATENT DOCUMENTS

| | | | |
|---|---|---|---|
| 7,183,759 B1 | 2/2007 | Malendevich et al. | |
| 7,184,626 B1* | 2/2007 | Gunn, III | G02B 6/12007 324/750.23 |
| 8,116,624 B1* | 2/2012 | Wach | G01M 11/35 398/20 |
| 8,948,555 B1* | 2/2015 | Roth | G02B 6/125 385/27 |
| 9,261,556 B2 | 2/2016 | McShane et al. | |
| 9,453,723 B1* | 9/2016 | LeMaitre | G01R 31/31728 |
| 9,459,177 B1 | 10/2016 | Dong et al. | |
| 9,529,154 B2* | 12/2016 | Van Steenberge | C03C 23/0025 |
| 9,632,249 B1 | 4/2017 | Dangel et al. | |
| 9,678,271 B2* | 6/2017 | Thacker | G02B 6/12004 |
| 9,678,288 B2* | 6/2017 | Takahashi | G02B 6/122 |
| 10,113,934 B2* | 10/2018 | Bovington | G01M 11/005 |
| 10,161,830 B2* | 12/2018 | Le Maitre | H04B 10/07 |
| 10,324,261 B2* | 6/2019 | Leijtens | G02B 6/30 |
| 10,416,389 B2* | 9/2019 | de Boer | G02B 6/12007 |
| 2002/0109520 A1 | 8/2002 | Heald et al. | |
| 2004/0001664 A1 | 1/2004 | Wang et al. | |
| 2015/0180201 A1* | 6/2015 | Zhang | H01S 3/005 372/20 |
| 2017/0205581 A1* | 7/2017 | de Boer | G02B 6/305 |
| 2018/0364426 A1* | 12/2018 | ten Have | G02B 6/126 |
| 2019/0162628 A1* | 5/2019 | Huang | G01M 11/30 |

OTHER PUBLICATIONS

Franck Chollet et al., "Compact Evanescent Optical Switch and Attenuator with Electromechanical Actuation," IEEE journal of selected topics in quantum electronics, vol. 5, No. 1, Jan./Feb. 1999, pp. 52-58.

* cited by examiner

OPTICAL MEASUREMENT APPARATUS

CROSS-REFERENCE TO RELATED APPLICATION

This application claims the priority benefit of Taiwan application serial no. 107143321, filed on Dec. 3, 2018. The entirety of the above-mentioned patent application is hereby incorporated by reference herein and made a part of this specification.

TECHNICAL FIELD

The disclosure relates to an optical measurement apparatus.

BACKGROUND

In a general semiconductor production process, wafer acceptance test (WAT) is a considerably important in-line test as a basis to judge whether the manufacturing process is acceptable and whether the die is good or bad; also, the test serves as a direct proof of monitoring variations of the manufacturing process.

Besides, compared to the traditional production semiconductor process of electronic integrated circuits, silicon optical waveguides of photonic integrated circuits (photonic ICs) may meet several different problems in manufacturing such as: 1. the layout is more difficult and the design rule checking is more complicated; 2. the structural roughness and etch depth obtained by the manufacturing process is more sensitive; 3. the performance of device process cannot be verified quickly, and the measurement method of optical input and optical output is more complicated than the measurement method of electrical test.

A known measurement method of photonic IC is to fabricate a diffraction grating on a structure of a silicon optical waveguide, and an optical fiber aligns to the diffraction grating to receive diffracted light from the diffraction grating to achieve the purpose of optical output. However, adopting the method is likely to make it uneasy for the optical fiber to align to the diffraction grating with highly precise alignment requirement; thus, it is more difficult for the method to achieve the purpose of optical output. Besides, limited by the size of the diffraction grating and the optical fiber, it is difficult to achieve multiple optical inputs and output ports in a limited area of an photonic IC chip, and an array test is not easy.

SUMMARY

An embodiment of the disclosure provides an optical measurement apparatus configured to measure a photonic integrated circuit. The optical measurement apparatus includes a substrate, at least one optical waveguide device, a first connector and a second connector. The at least one optical waveguide device is disposed on the substrate. The first connector and the second connector are connected to the at least one optical waveguide device. The at least one optical waveguide device includes a first optical waveguide and a second optical waveguide separated from each other. The first optical waveguide is connected to the first connector, and the second optical waveguide is connected to the second connector. An optical signal from a first optical fiber is sequentially transmitted to the first optical waveguide device through the first connector, transmitted to the inside of the photonic IC though at least one first evanescent coupler of the photonic IC, transmitted to the second optical waveguide device though at least one second evanescent coupler of the photonic IC and transmitted to at least one second optical fiber through the second connector.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
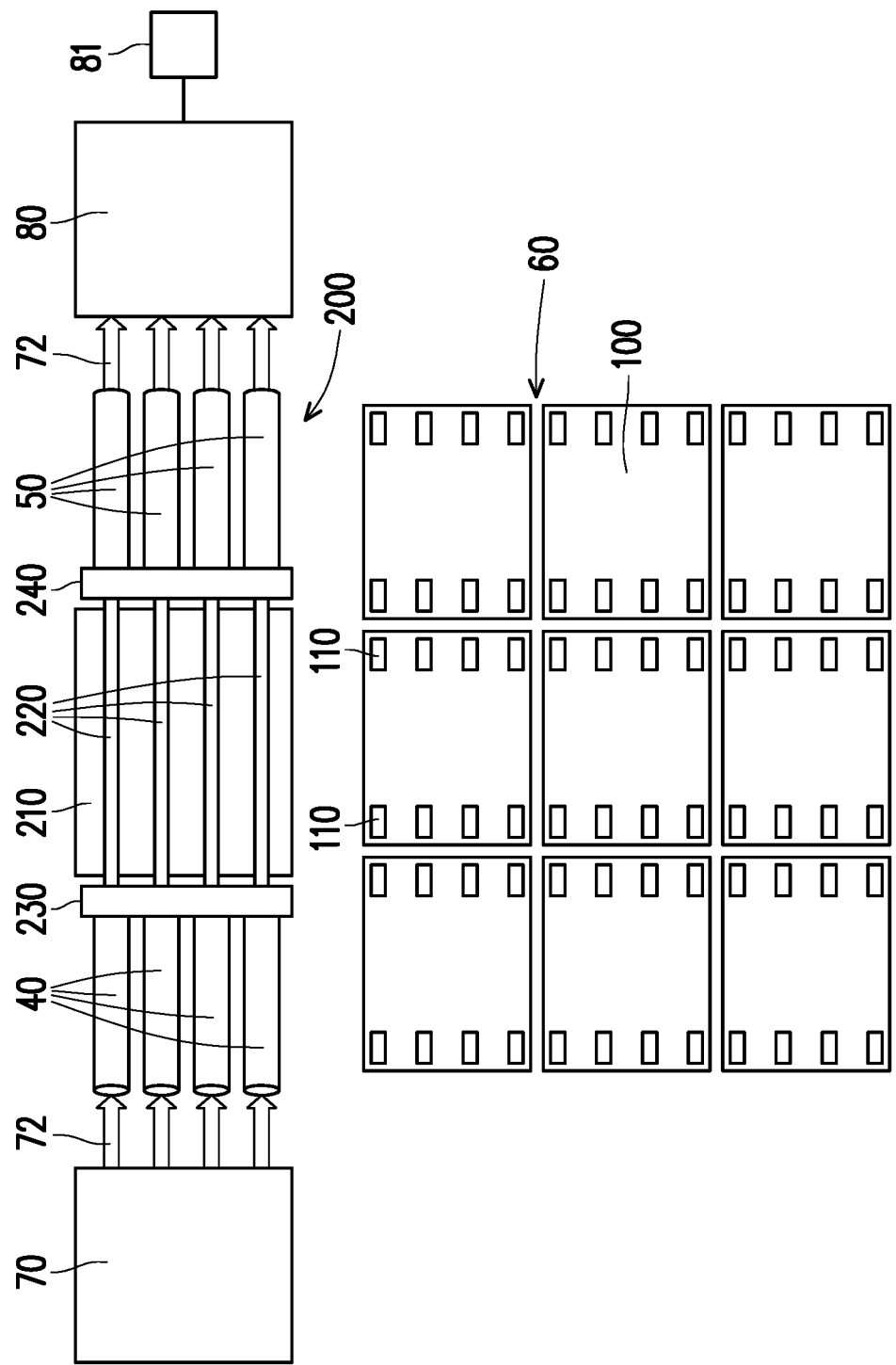
FIG. 1 is a schematic view of an optical measurement apparatus and a photonic integrated circuit (photonic IC) chip according to an embodiment of the disclosure.
Figure 2:
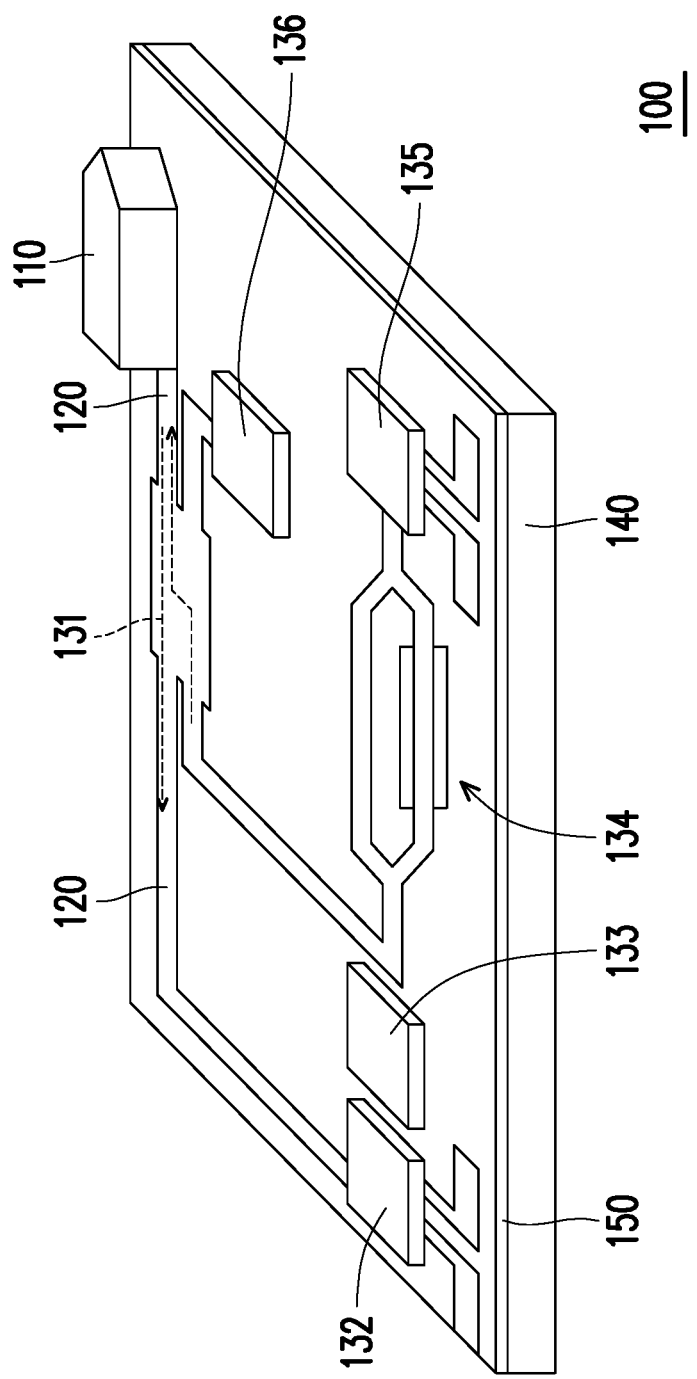
FIG. 2 is a partial schematic view of the photonic IC chip in FIG. 1.
Figure 3A:
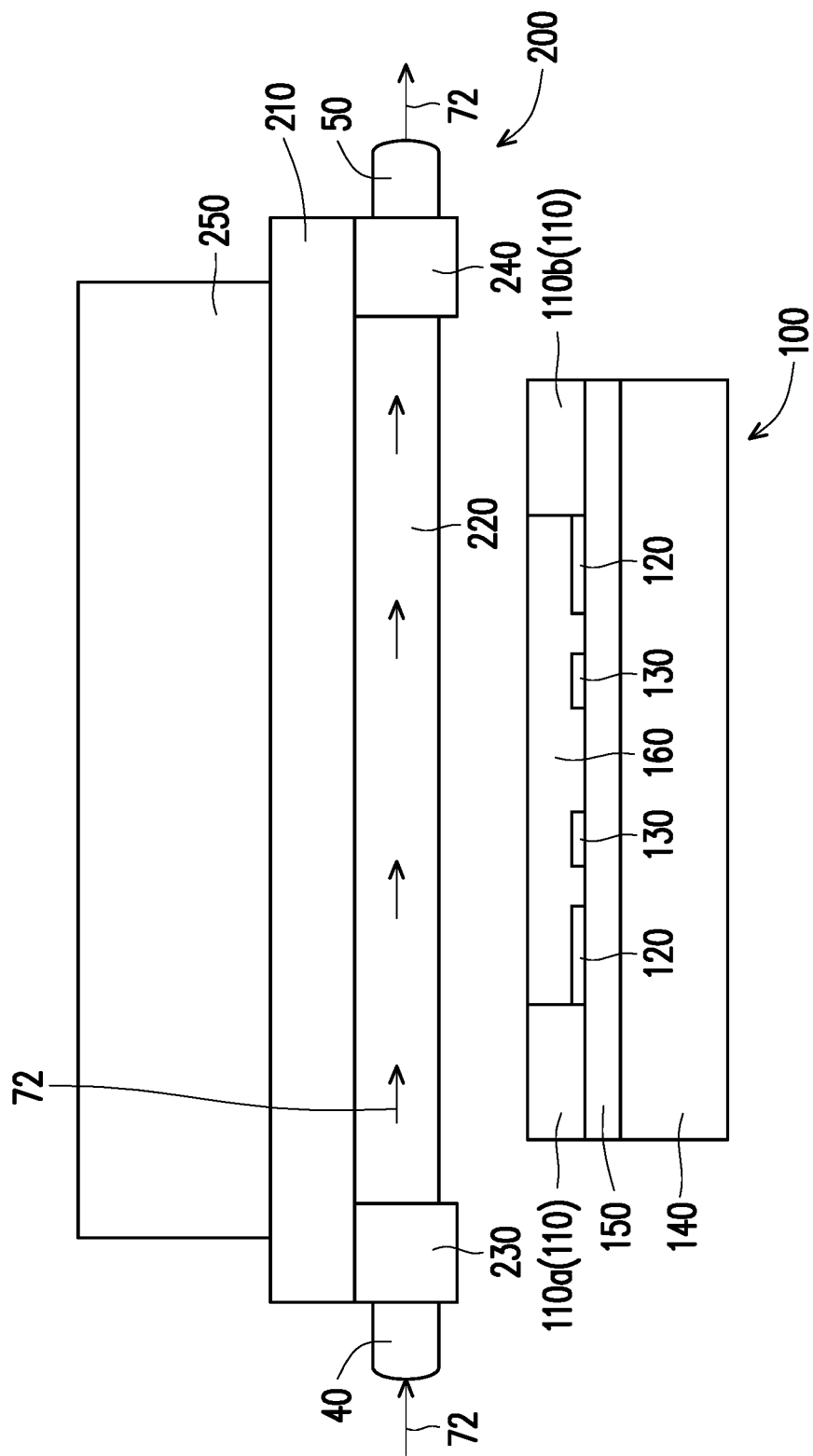
FIG. 3A is a schematic view when the optical measurement apparatus in FIG. 1 has not performed measurement to the photonic IC chip.
Figure 3B:
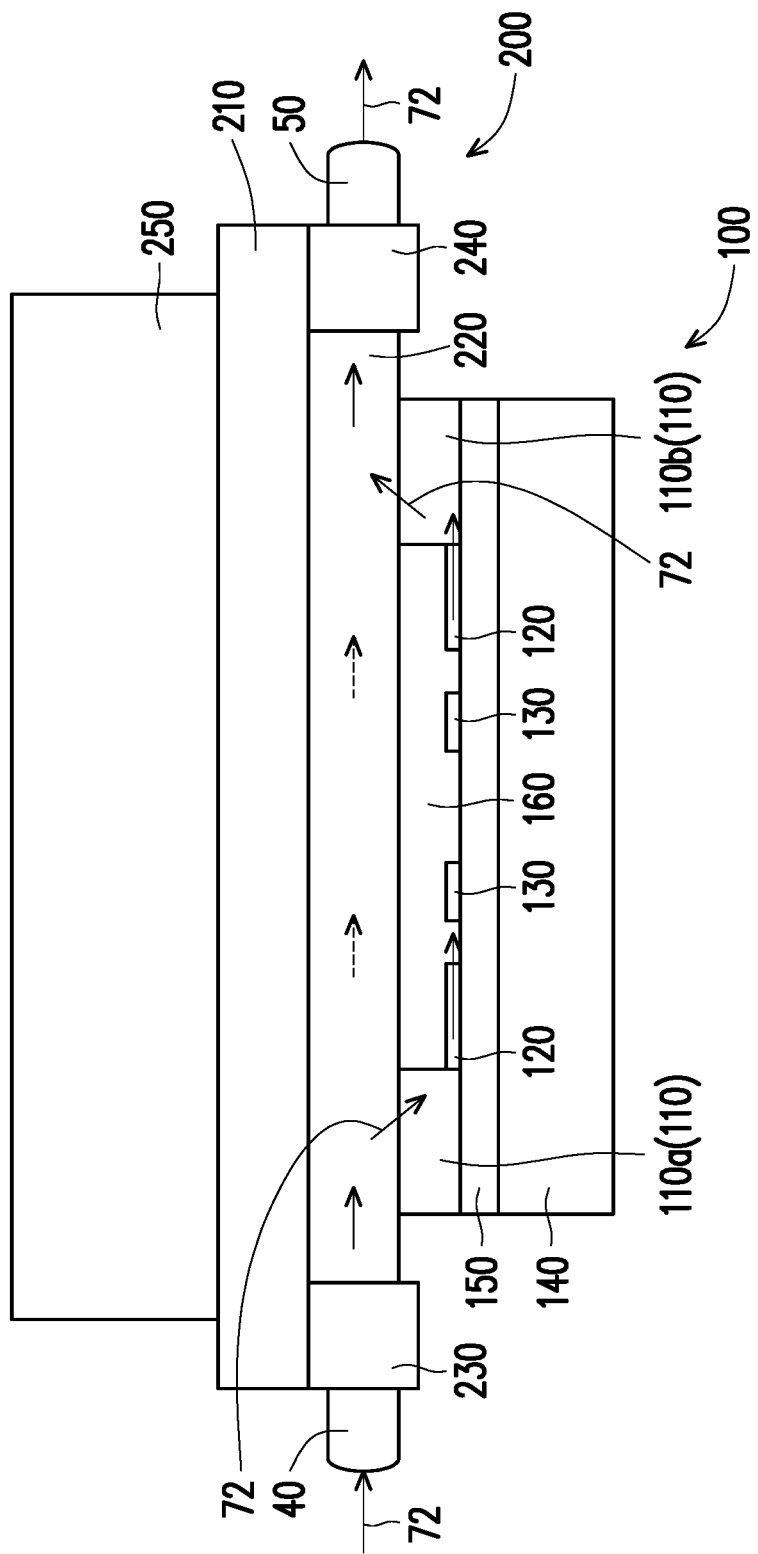
FIG. 3B is a schematic view when the optical measurement apparatus in FIG. 1 performs measurement to the photonic IC chip.
Figure 4:
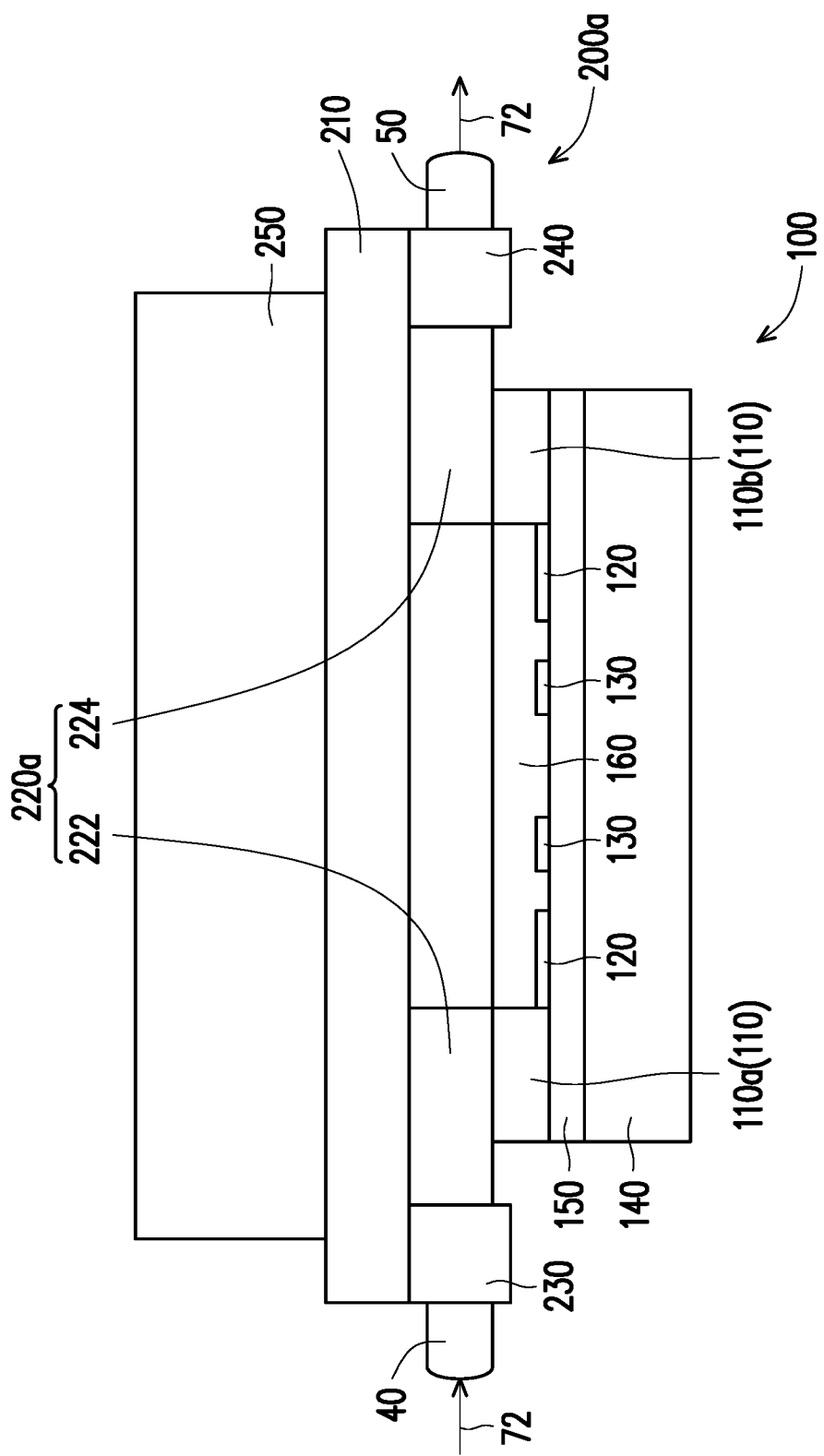
FIG. 4 is another variation of an optical waveguide device in an optical measurement apparatus.
Figure 5:
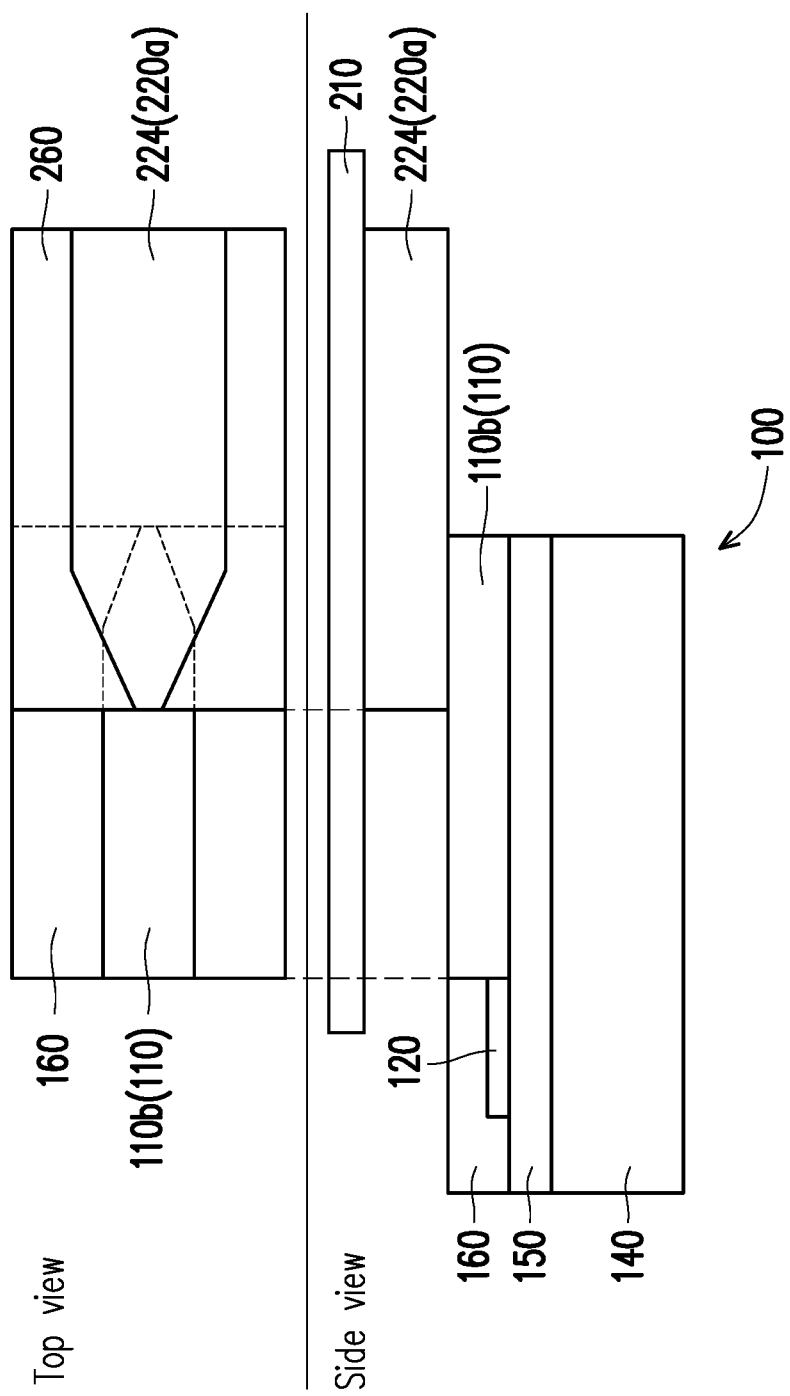
FIG. 5 is a top view and a side view showing a corresponding relationship of an evanescent coupler and an optical waveguide device when the optical measurement apparatus of FIG. 4 is performing measurement to an optical IC chip.

FIG. 1 is a schematic view of an optical measurement apparatus and a photonic integrated circuit (photonic IC) chip according to an embodiment of the disclosure; FIG. 2 is a partial schematic view of the photonic IC chip in FIG. 1; FIG. 3A is a schematic view when the optical measurement apparatus in FIG. 1 has not yet performed a measurement to the photonic integrated circuit chip; FIG. 3B is a schematic view when the optical measurement apparatus in FIG. 1 performs a measurement to the photonic IC chip; FIG. 4 is another variation of an optical waveguide device in an optical measurement apparatus; and FIG. 5 is a top view and a side view showing a corresponding relationship between an evanescent coupler and an optical waveguide device when the optical measurement apparatus of FIG. 4 performs a measurement to the photonic IC chip.

Please refer to FIG. 1 to FIG. 5, an optical measurement apparatus 200 in this embodiment is configured to measure a photonic integrated circuit (photonic IC), which is, for example, a photonic IC chip 100. In the manufacturing process of the photonic IC chip 100, a plurality of photonic IC chips 100 arranged in an array matrix may be manufactured on a wafer, and the photonic IC chips 100 are separated by scribe lines 60. The optical measurement apparatus 200 includes a substrate 210, at least one optical waveguide device 220 (a plurality of optical waveguide devices 220 are shown as an example in FIG. 1), a first connector 230 and a second connector 240. The at least one optical waveguide device 220 is disposed on the substrate 210. The first connector 230 and a second connector 240 are connected to the at least one optical waveguide device 220.

When the optical measurement apparatus 200 measures the photonic IC chip 100, an optical signal 72 from a first optical fiber 40 is sequentially transmitted to the at least one optical waveguide device 220 through the first connector 230, transmitted to the inside of the photonic IC chip 100 from the at least one optical waveguide device 220 through at least one first evanescent coupler 110a of the photonic IC chip 100, transmitted to the at least one optical waveguide device 220 from the inside of the photonic IC chip 100 through at least one second evanescent coupler 110b of the photonic IC chip 100, and transmitted to a second optical fiber 50 from the at least one optical waveguide device 220 through the second connector 240.

In the present embodiment, the photonic IC chip 100 includes a plurality of evanescent couplers 110 including the abovementioned at least one first evanescent coupler 110a and the abovementioned at least one second evanescent coupler 110b, and an evanescent coupler 110 are shown in FIG. 2 as a representative. In addition, the photonic IC chip 100 further includes a substrate 140, a buried oxide layer 150, a plurality of waveguides 120 and a plurality of devices 130. The substrate 140 is, for example, a silicon substrate.

The buried oxide layer 150 is disposed on the substrate 140. The evanescent couplers 110, waveguides 120 and the plurality of devices 130 are disposed on the buried oxide layer 150. The waveguides 120 are, for example, silicon waveguides. The plurality of devices 130 may include a multiplexing and demultiplexing device 131, a photodetector 132, a transimpedance amplifier 133, a modulator 134, a laser diode 135, a monitor 136, other electronic or optoelectronic devices or suitable combinations thereof, wherein the waveguides 120 may connect the multiplexing and demultiplexing device 131, photodetector 132, modulator 134, laser diode 135 and monitor 136 so as to make the optical signal 72 transmitted among the plurality of devices 130. The transimpedance amplifier 133 may be electrically connected to the photodetector 132 to amplify the electrical signal from the photodetector 132.

In an embodiment of FIG. 3A, the optical waveguide device 220 is an optical waveguide extended to a second connector 240 from a first connector 230. However, in an embodiment of FIG. 4, the optical waveguide device 220a includes a first optical waveguide 222 and a second optical waveguide 224 separated from each other, wherein the first optical waveguide 222 is connected to the first connector 230, and the second optical waveguide 224 is connected to the second connector 240. In the present embodiment, the material of the optical waveguides device 220 and 220a are, for example, silicon nitride, silicon oxynitride or polymer, but is not limited hereto. In the embodiments of FIG. 1 and FIG. 3A, the length of the optical waveguide (which is the optical waveguide device 220) is equal to or slightly greater than the shortest distance between the first connector 230 and the second connector 240, which means that the optical waveguide is extended as a straight line, but the disclosure is not limited hereto.

An end of the evanescent coupler 110 is a tapered end. In the present embodiment, the width of the end of the evanescent coupler 110 in the direction parallel to the surface of the substrate 140 is tapered; however, the thickness thereof in the direction perpendicular to the surface of the substrate 140 is kept constant as shown in FIG. 5. Besides, in an embodiment of FIG. 4, an end of the optical waveguide 222 closed to the first evanescent coupler 110a is a tapered end, and an end of the second optical waveguide 224 closed to the second evanescent coupler 110b is a tapered end. In the present embodiment, the widths of the ends of the first optical waveguide 222 and the second optical waveguide 224 in the direction parallel to the surface of the substrate 210 are tapered; however, the thickness thereof in the direction perpendicular to the substrate 140 is kept constant.

In the present embodiment, when the optical measurement apparatus 200 measures the photonic IC chip 100, the optical waveguide device 220 or 220a directly contacts the first evanescent coupler 110a, and directly contacts the second evanescent coupler 110b. In an embodiment of FIG. 3B, a part of the optical signal 72 from the first connector 230 and transmitted in the optical waveguide device 220 are transmitted to the waveguide 120 (a silicon waveguide, for example) in the photonic IC chip 100 through the first evanescent coupler 110a. The optical signal 72 transmitted in the waveguide 120 is then transmitted to the optical waveguide device 220 through the second evanescent coupler 110b. In addition, as shown in FIG. 3A, when the optical measurement apparatus 200 does not measure the photonic IC chip 100, the optical signal 72 from the first connector 230 is directly transmitted to the second evanescent coupler 110b through the optical waveguide device 220 and is output through the second optical fiber 50, the obtained optical signal 72 obtained by which may be used to calibrate the optical measurement apparatus 200.

In the present embodiment, as shown in FIG. 1, a light source 70 may be disposed on an end of the first optical fiber 40, and the optical signal 72 emitted by the light source 70 is input into the optical measurement apparatus 200 through the first optical fiber 40. On the other hand, an optical power meter 80 or any other photodetector may be disposed on an end of the second optical fiber 50. The optical measurement apparatus 200 may output the optical signal 72 to the optical power meter 80 through the second optical fiber 50. In an embodiment of FIG. 3B, with the power of the optical signal 72 measured by the optical power meter 80, whether the measured photonic IC chip 100 is good or bad may be determined. On the other hand, by comparing the power of the optical signal 72 obtained by the optical power meter 80 under the scenario FIG. 3A (not during measurement) with that under the scenario of FIG. 3B (during measurement), whether the measured photonic IC chip 100 is good or bad may be determined more accurately.

In addition, in an embodiment of FIG. 4, when the optical measurement apparatus 200a measures the photonic IC chip 100, the first optical waveguide 222 directly contacts the first evanescent coupler 110a, and the second optical waveguide 224 directly contacts the second evanescent coupler 110b. The optical signal 72 from the first connector 230 is input into the first optical waveguide 222, and the optical signal 72 transmitted in the first optical waveguide 222 is transmitted to the waveguide 120 (a silicon waveguide, for example) in the photonic IC chip 100 through the first evanescent coupler 110a. The optical signal 72 transmitted in the waveguide 120 is transmitted to the second optical waveguide 224 through the second evanescent coupler 110b, and the optical signal transmitted in the second optical waveguide 224 is transmitted to the second optical fiber 50 through the second connector 240.

In embodiments of FIGS. 3A, 3B and 4, the optical measurement apparatus 200, 200a further includes a holder 250, wherein the substrate 210 is disposed on the holder 250. In the abovementioned embodiment, the substrate 210 is located between the optical waveguide device 220 and the holder 250. Besides, the photonic IC chip 100 may further include an insulating layer 160, covering the waveguide 120 and the devices 130, wherein the refractive index of the insulating layer 160 is lower than the refractive index of the optical waveguide device 220, 220a, and lower than the refractive index of the waveguide 120. Moreover, the refractive index of the optical waveguide device 220, 220a may be greater than the refractive index of the first optical fiber 40 and the second optical fiber 50. Also, the optical measurement apparatus 200, 200a may further include a holding layer 260 disposed beside the optical waveguide device 220. If the optical measurement apparatuses 200, 200a has a plurality of optical waveguide devices 220 (as shown in FIG. 1) or a plurality of waveguide devices 220a, and the holding layer 260 may be filled in the space between the plurality of optical waveguide devices 220, 220a. In addition, the refractive index of the optical waveguide devices 220, 220a is greater than the refractive index of the holding layer 260, and the material of the holding layer 260 is, for example, polymer.

In the optical measurement apparatus 200, 200a of the present embodiment, since the optical waveguide device 220, 220a is adopted to perform the input and output of the optical signal to and from the evanescent couplers 110 on the photonic IC chip 100, the layout of the evanescent coupler 110 on the photonic IC chip 100 may not be limited by the size and the measurement direction of the optical fibers. In other words, the layout of the optical waveguide device 220, 220a may be adjusted with flexibility to serve as a bridge between the evanescent coupler 110 and the optical fiber. Thus, the problem that the optical fiber cannot align to the diffraction grating easily in the known technology may not occur. Also, by the flexible adjustment of the layout of the optical waveguide device 220, 220a, the array test may be achieved easily. In addition, with the optical waveguide device 220, 220a, all the evanescent couplers 110 in different directions on the photonic IC chip 100 may be measured at one time according to the requirement. Besides, the sizes of the optical waveguide devices 220 and 220a may be reduced, so as to greatly reduce the required area of the optical input and output and not be limited by the size of the optical fiber.

In the embodiment of FIG. 1, the plurality of first optical fibers 40, the plurality of optical waveguide devices 220 and the plurality of second optical fibers 50 correspond to each other in a way of one to one, but the disclosure is not limited thereto. In other embodiments, one first optical fiber 40 may correspond to a plurality of optical waveguide devices 220, and correspond to one second optical fiber 50. Specifically, the optical signal 72 from the first optical fiber 40 is divided into a plurality of sub-signals by the first connector 230 and are transmitted in the optical waveguide devices 220, respectively. The plurality of sub-signals are transmitted to the plurality of first evanescent couplers 110a from the optical waveguides devices 220, respectively, and are transmitted to the optical waveguides device 220 from the plurality of second evanescent couplers 110b, respectively, and the plurality of sub-signals are merged into the optical signal 72, and are transmitted from the optical waveguide devices 220 to a second optical fiber 50 through the second connector 240. In the embodiment of FIG. 1, the plurality of sub-signals are transmitted to the plurality of second optical fibers 50 from the optical waveguide devices 220 through the second connector 240, respectively (as shown in FIG. 1). In the present embodiment, the optical signal 72 may be a light having wider wavelength range, and is split into sub-signals having different narrower wavelength ranges. In the end, the sub-signals are merged into the optical signal 72 having a wider wavelength range.

Figure 6:
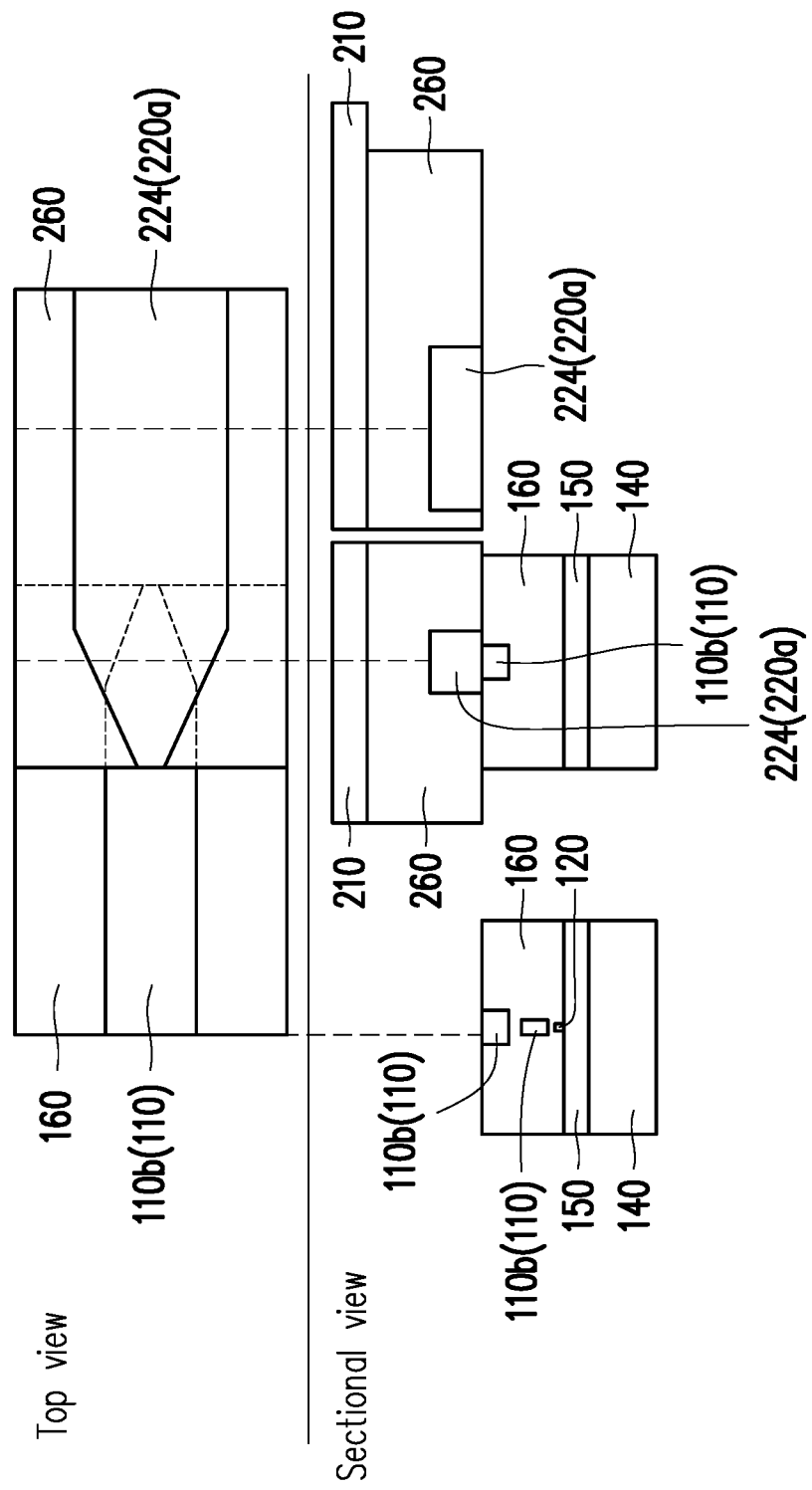
FIG. 6 is a top view and a sectional view showing a corresponding relationship of an evanescent coupler and an optical waveguide device when an optical measurement apparatus performs measurement to a photonic IC chip according to another embodiment of the disclosure.

FIG. 6 is a top view and a sectional view showing a corresponding relationship of an evanescent coupler and an optical waveguide device when an optical measurement apparatus is performing measurement to a photonic IC chip according to another embodiment of the disclosure, wherein the three cross-sections at the bottom of the drawing are respectively the cross-sections obtained by cutting the top view at the top of the drawing along the three dotted lines. Please refer to FIG. 6, the evanescent coupler 110 may have multiple-layered structure, wherein an upper layer thereof may contact the optical waveguide device 220a (as shown in the lower-middle cross-section of FIG. 6), and a lower layer thereof may be nearby the waveguide 120 (as shown in the lower-left cross-section of FIG. 6) and a material of the insulating layer 160 may be filled between each layer and between the lower layer and the waveguide 120. Besides, the optical coupler between each layer may adopt the method of evanescent coupling. In addition, the evanescent coupler 110 in FIG. 6 may take the second evanescent coupler 110b as an example, but the same structure may also apply to the first evanescent coupler 110a.

Figure 7B:
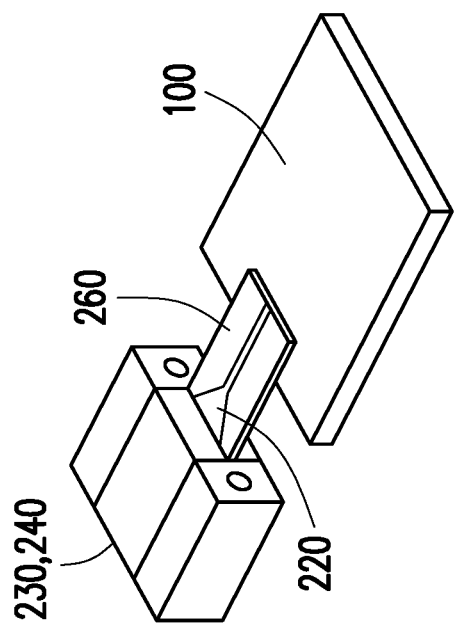
FIG. 7B is a perspective schematic view of a connector, an optical waveguide device and a photonic IC chip in FIG. 7A.
Figure 7A:
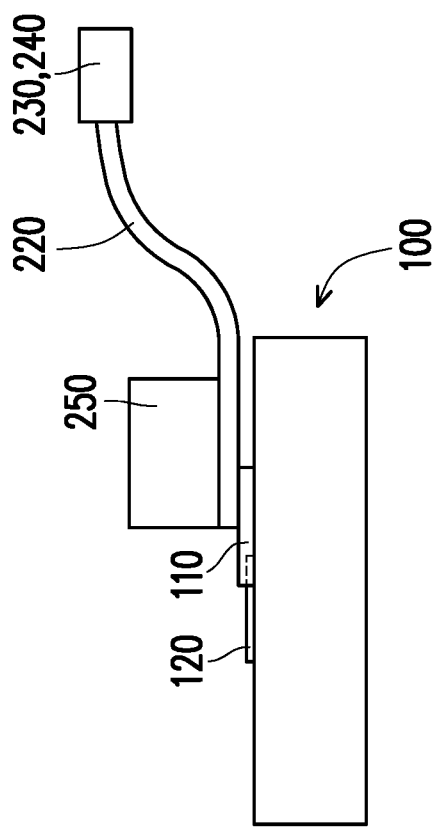
FIG. 7A is a side schematic view of an evanescent coupler and an optical waveguide device when an optical measurement apparatus measures a photonic IC chip according to an embodiment of the disclosure.
Figure 8:
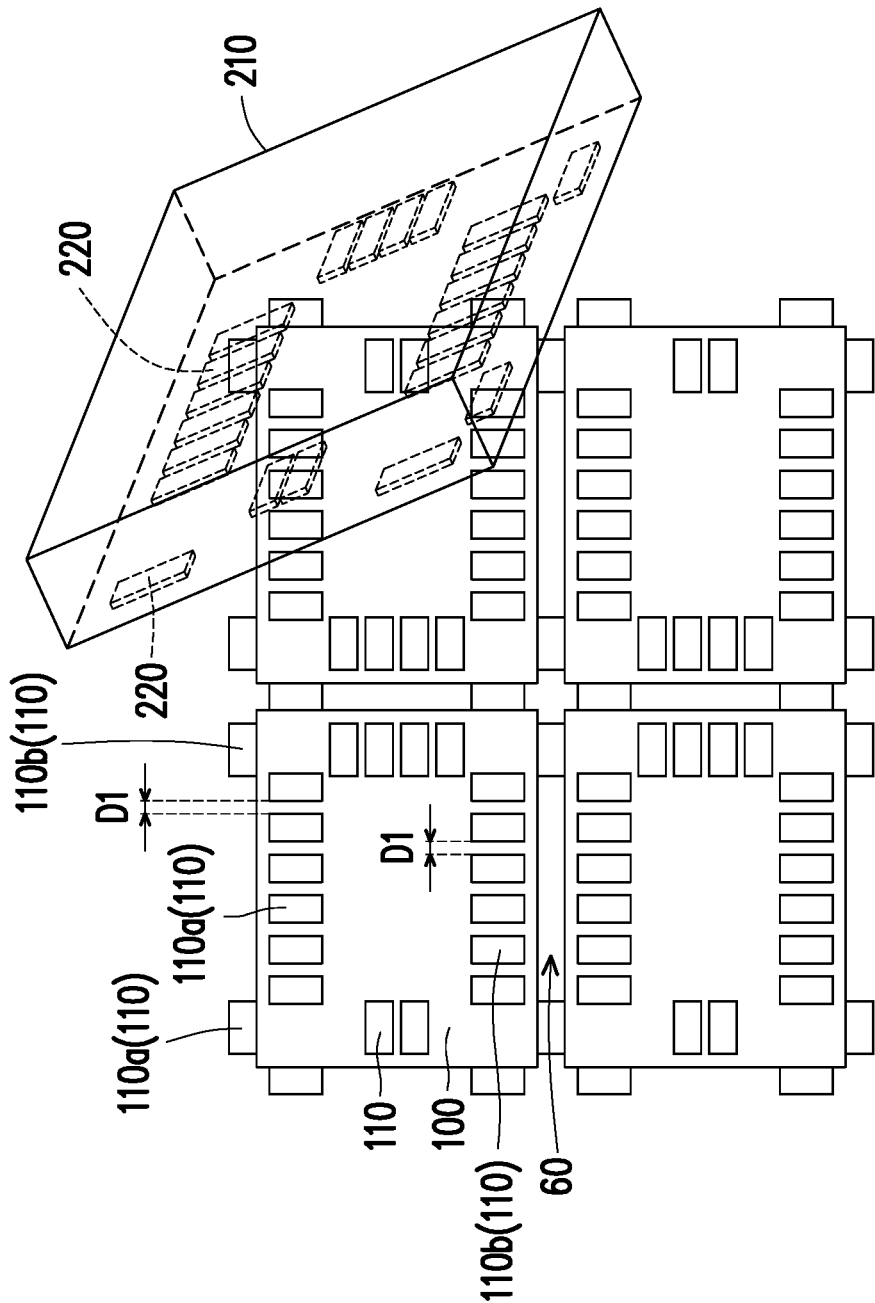
FIG. 8 shows a corresponding relationship among a substrate and optical waveguide devices of an optical measurement apparatus and evanescent couplers of a photonic IC chip according to an embodiment of the disclosure.
Figure 9:
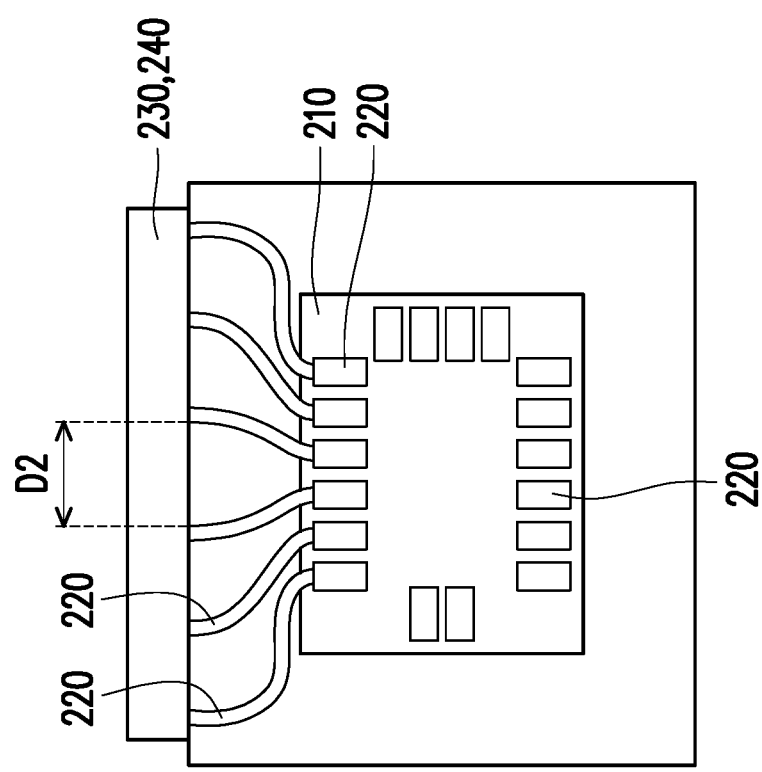
FIG. 9 is a bottom schematic view of a partial structure of an optical measurement apparatus according to an embodiment of the disclosure.

FIG. 7A is a side schematic view of an evanescent coupler and an optical waveguide device when an optical measurement apparatus measures an photonic IC chip according to an embodiment of the disclosure; FIG. 7B is a perspective schematic view of a connector, an optical waveguide device and a photonic integrated circuit chip in FIG. 7A; FIG. 8 shows a corresponding relationship among a substrate and optical waveguide devices of an optical measurement apparatus and evanescent couplers of a photonic IC chip according to an embodiment of the disclosure; FIG. 9 is a bottom schematic view of a partial structure of an optical measurement apparatus according to an embodiment of the disclosure. Please refer to FIG. 7A, FIG. 7B, FIG. 8 and FIG. 9. From FIG. 7A, it can be known that the optical waveguide device 220 may be flexible to be suitable for the disposed location of each connector (such as the first connector 230 and the second connector 240). Besides, the plurality of optical waveguide devices 220 may be fan-out from the ends of the plurality of optical waveguide devices 220 closed to the photonic IC chip 100 to ends thereof closed to the connector, which means that spreading out like the shape of a fan (as shown in FIG. 9), and the fan-out shape shown in 7B is like FIG. 9 that includes a plurality of optical waveguide devices 220, and there is a holding layer 260 filled between the adjacent optical waveguide devices 220 and on two sides of the plurality of optical waveguide devices 220. From FIG. 8, it can be known that the layout locations of the ends of the plurality of optical waveguide devices 220 may correspond to the layout locations of the evanescent coupler 110 of the photonic IC chip 100, and may be located on the four edges of the substrate 210 or the scribe lines 60. Therefore, the measurement locations are not limited by the measurement direction of the optical fiber. The fan-out shape of the plurality of optical waveguide devices 220 as shown in FIG. 9 only shows the optical waveguide device 220 at the top of FIG. 9 as an example. In fact, the optical waveguide devices 220 at both the right and left sides and the bottom side of FIG. 9 may all have fan-out shapes and connectors connected thereto. In an embodiment, each of four sides of the substrate 210 may be provided with a connector, and the optical waveguide devices 220 at the four sides of the substrate 210 fan out to the connectors at the four sides, respectively. Or, in another embodiment, connectors may be disposed on two opposite sides of the substrate 210, and the plurality of optical waveguide devices 220 on the substrate 210 fan out and extend to the connectors on the two opposite sides, respectively.

Please refer to FIG. 8 and FIG. 9. In the present embodiment, the plurality of optical waveguide devices 220 are coupled to the first evanescent coupler 110a, respectively, and are coupled to the second evanescent coupler 110b, respectively, wherein an interval D1 between neighbors of the first evanescent couplers 110a or an interval D1 between neighbors of the second evanescent coupler 110b is less than an interval D2 of the plurality of optical waveguide devices 220 at the first connector 230 and at the second connector 240. Thus, the density and number of the evanescent couplers on the photonic IC chip 100 may be greater and not limited by the size of the optical fiber. Also the difficulty of dense optical fiber alignment issue may not occur.

Figure 10A:
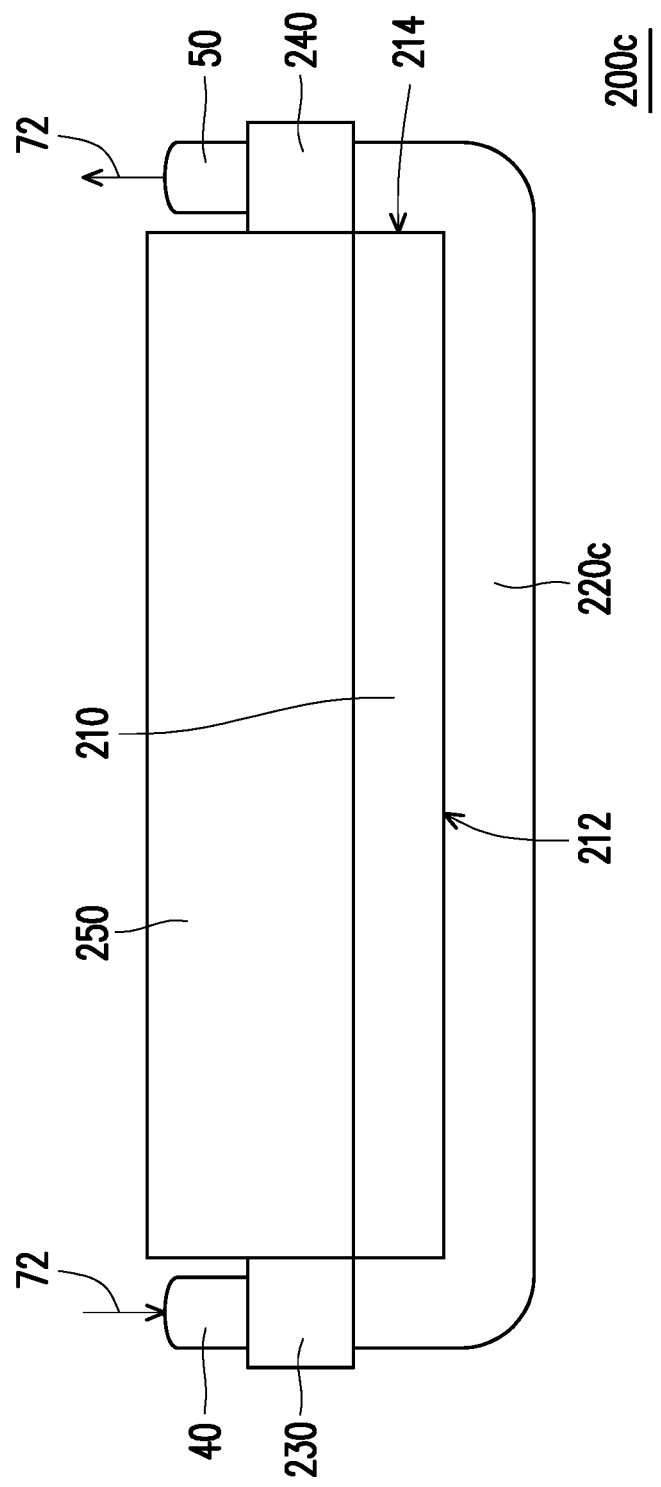
FIG. 10A is a sectional schematic view of an optical measurement apparatus according to another embodiment of the disclosure.
Figure 10B:
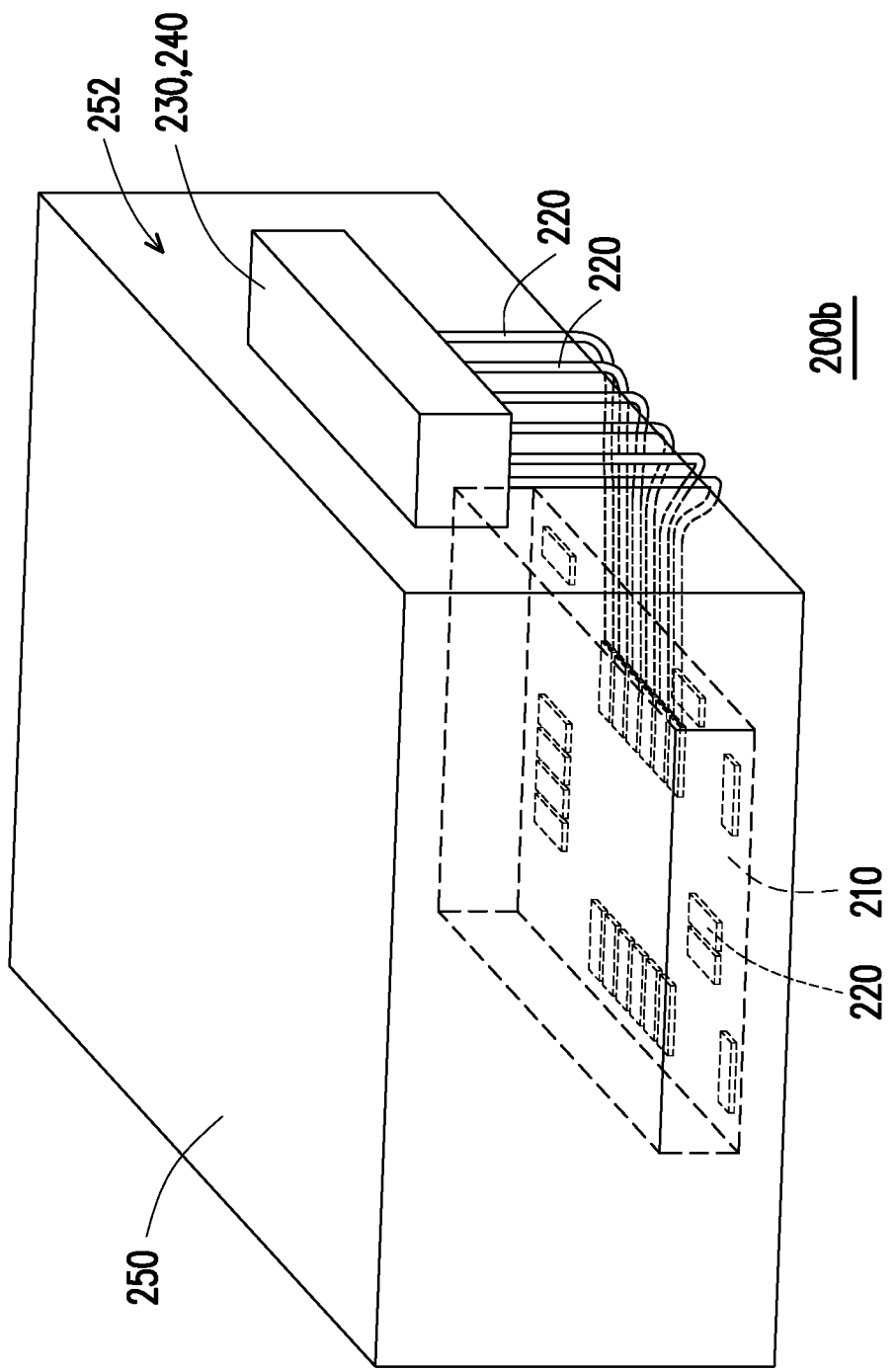
FIG. 10B is a perspective schematic view of a partial structure of an optical measurement apparatus according to still another embodiment of the disclosure.

FIG. 10A is a sectional schematic view of an optical measurement apparatus according to another embodiment of the disclosure, and FIG. 10B is a perspective schematic view of a partial structure of an optical measurement apparatus of still another embodiment of the disclosure. Please refer to FIG. 10A. The optical measurement apparatus 200c of the present embodiment is similar to the optical measurement apparatus 200 of FIG. 3A, and the differences of the two apparatuses are as follows. In the optical measurement apparatus 200c of the present embodiment, the length of an optical waveguide (which is an optical waveguide device 220c) is greater than the shortest distance between a first connector 230 and a second connector 240; in other words, the optical waveguide has a bendable part. In the present embodiment, the optical waveguide (which is the optical waveguide device 220c) is bent to a side surface 214 of the substrate 210 from a bottom surface 212 of a substrate 210. Besides, in the present embodiment, the first connector 230 and the second connector 240 may be disposed on the side surface of the holder 250.

Please refer to FIG. 10B again. An optical measurement apparatus 200b of the present embodiment is similar to the optical measurement apparatus of FIG. 9, and the differences between the two apparatuses are as follows. In the optical measurement apparatus 200b of the present embodiment, apart from the general fan-out as shown in FIG. 9, the plurality of optical waveguide devices 220 are bent to the side surface of the substrate and the side surface 252 of the holder 250 from the bottom surface of the substrate as shown in FIG. 10A after the fan-out, and are connected to the connector (the first connector 230 or the second connector 240, for example) on the side surface 252 of the holder 250. As the description of FIG. 9, FIG. 10B only shows that the optical waveguide devices 220 at the right side of the drawing are bent upward after extending to the right. However, actually the optical waveguide devices 220 at the front side, left side and back side in the drawing may also be bent or be extended to the appropriate direction; and connectors may be disposed on the four sides or the opposite two sides of the holder 250, and the plurality of optical waveguide devices 220 are respectively extended to the connectors disposed on the opposite two sides or the four sides.

Figure 11:
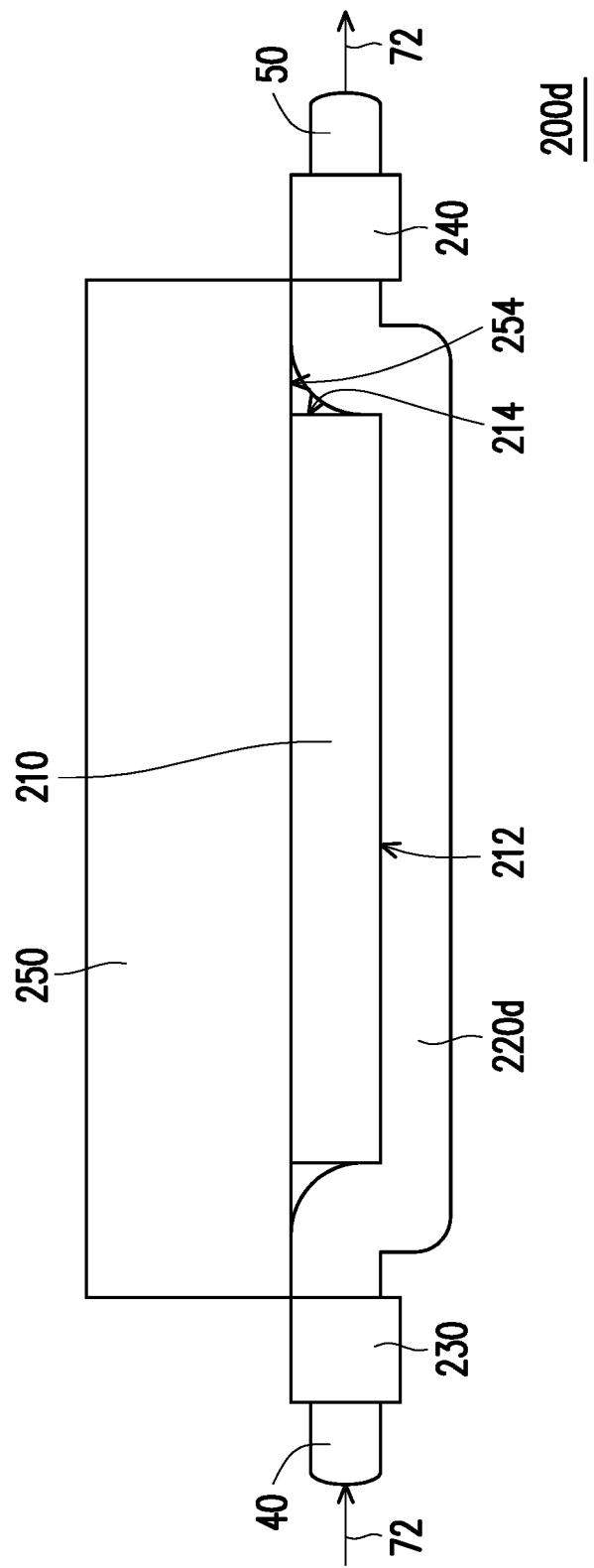
FIG. 11 is a sectional schematic view of an optical measurement apparatus according to yet another embodiment of the disclosure.

FIG. 11 is a sectional schematic view of an optical measurement apparatus according to yet another embodiment of the disclosure. Please refer to FIG. 11. An optical measurement apparatus 200d of the present embodiment is similar to the optical measurement apparatus 200c of FIG. 10A, and the differences between the two apparatuses are as follows. In an optical measurement apparatus 200d of the present embodiment, after the optical waveguide (which is the optical waveguide device 220d) is bent to the side surface 214 of the substrate 210 from the bottom surface 212 of the substrate 210, the optical waveguide is then bent to the bottom surface 254 of the holder 250 and is extended along the bottom surface 254 of the holder 250 and lastly connected to the connector 230, 240.

Figure 12:
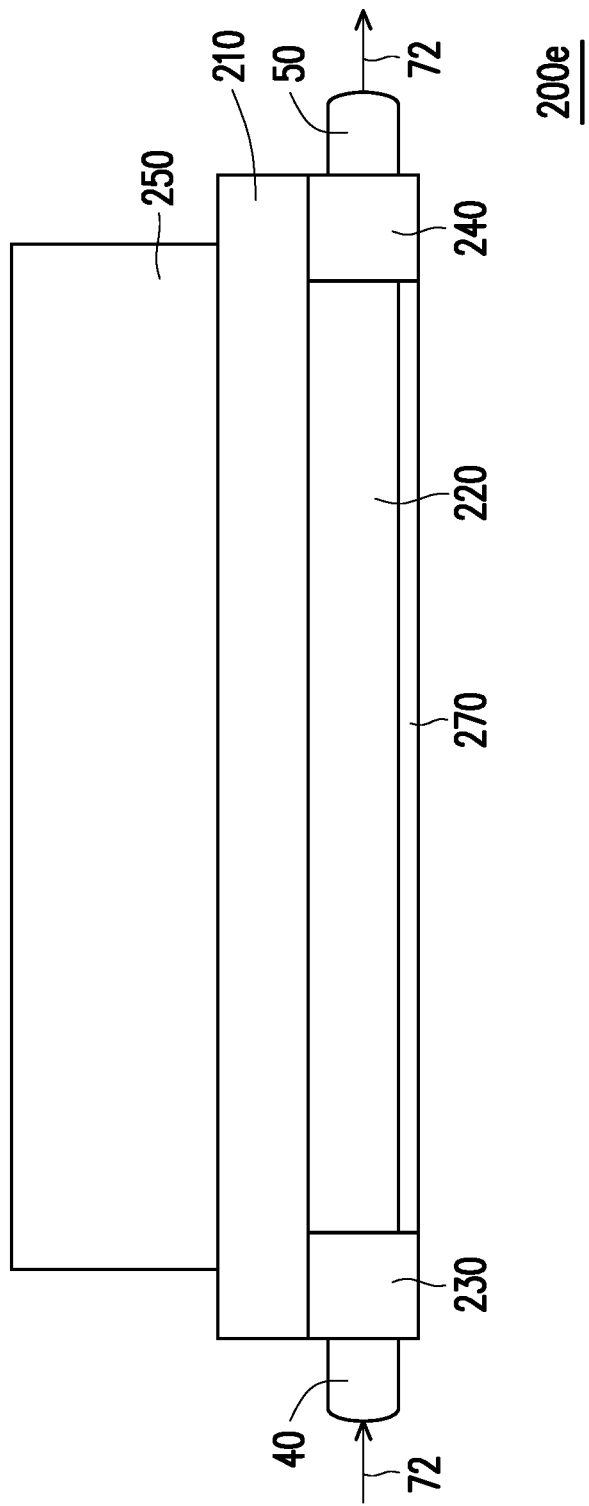
FIG. 12 is a sectional schematic view of an optical measurement apparatus according to another embodiment of the disclosure.

FIG. 12 is a sectional schematic view of an optical measurement apparatus according to another embodiment of the disclosure. Please refer to FIG. 12. An optical measurement apparatus 200e of the present embodiment is similar to the optical measurement apparatus 200 of FIG. 3B, and the differences between the two apparatuses are as follows. The optical measurement apparatus 200e of the present embodiment further includes a protective layer 270, covering the surface of the optical waveguide device 220. An optical signal 72 from the optical waveguide device 220 is transmitted to an evanescent coupler 110a through the protective layer 270, and the optical signal 72 from the second evanescent coupler 110b is transmitted to the optical waveguide device 220 through the protective layer 270. In other words, when the optical measurement apparatus 200e measures the photonic IC chip 100, the protective layer 270 contacts the first evanescent coupler 110a and the second evanescent coupler 110b. The refractive index of the protective layer 270 may be closed or consistent with the refractive index of the optical waveguide device 220.

Figure 13:
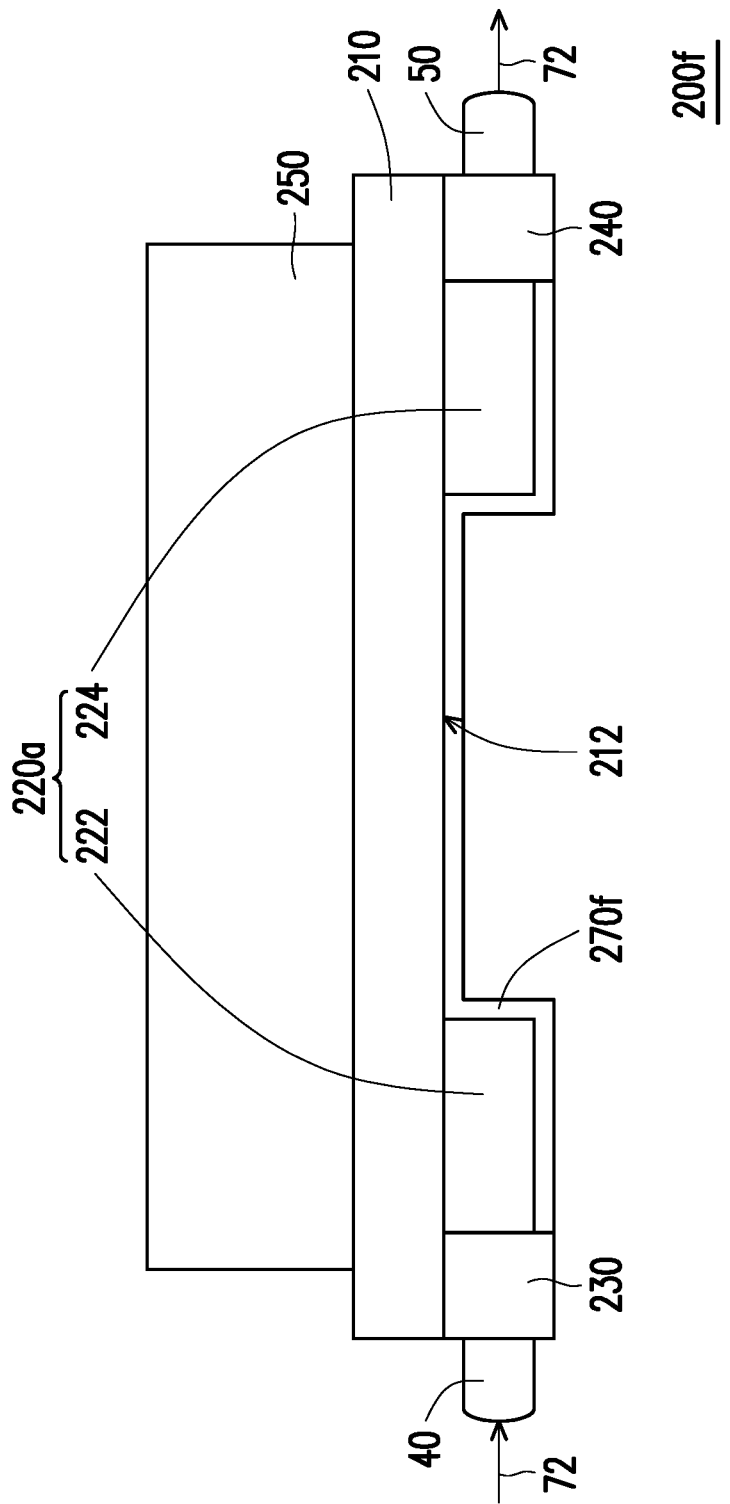
FIG. 13 is a sectional schematic view of an optical measurement apparatus according to still another embodiment of the disclosure.

FIG. 13 is a sectional schematic view of an optical measurement apparatus according to still another embodiment of the disclosure. Please refer to FIG. 13. An optical measurement apparatus 200f of the present embodiment is similar to the optical measurement apparatus 200e of FIG. 12, and the differences between the two apparatuses are as follows. The optical measurement apparatus 200f of the present embodiment adopts the optical waveguide device 220a as shown in FIG. 4, which includes the first optical waveguide 222 and the second optical waveguide 224, wherein the protective layer 270f covers the first optical waveguide 222, the second optical waveguide 224 and the bottom surface 212 of the substrate 210.

Figure 14:
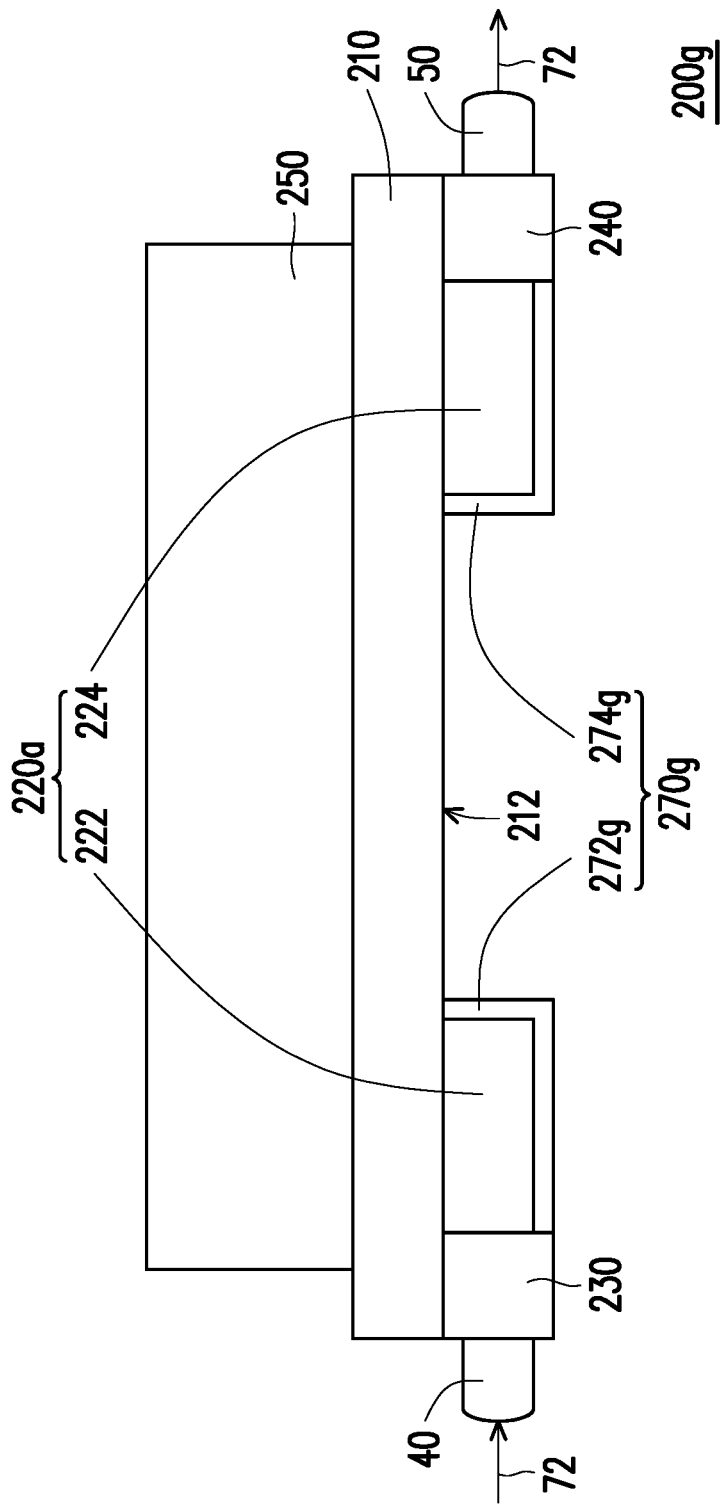
FIG. 14 is a sectional schematic view of an optical measurement apparatus according to yet another embodiment of the disclosure.

FIG. 14 is a sectional schematic view of an optical measurement apparatus according to yet another embodiment of the disclosure. Please refer to FIG. 14. An optical measurement apparatus 200g of the present embodiment is similar to the optical measurement apparatus 200f of FIG. 13, and the differences between the two apparatuses are as follows. In the optical measurement apparatus 200g of the present embodiment, the protective layer 270g may be divided into a sub-protective layer 272g and a sub-protective layer 274g which are separated from each other and cover the first optical waveguide 222 and the second optical waveguide 224, respectively, and the protective layer 270g exposes a part of the bottom surface 212 of the substrate 210.

Figure 15:
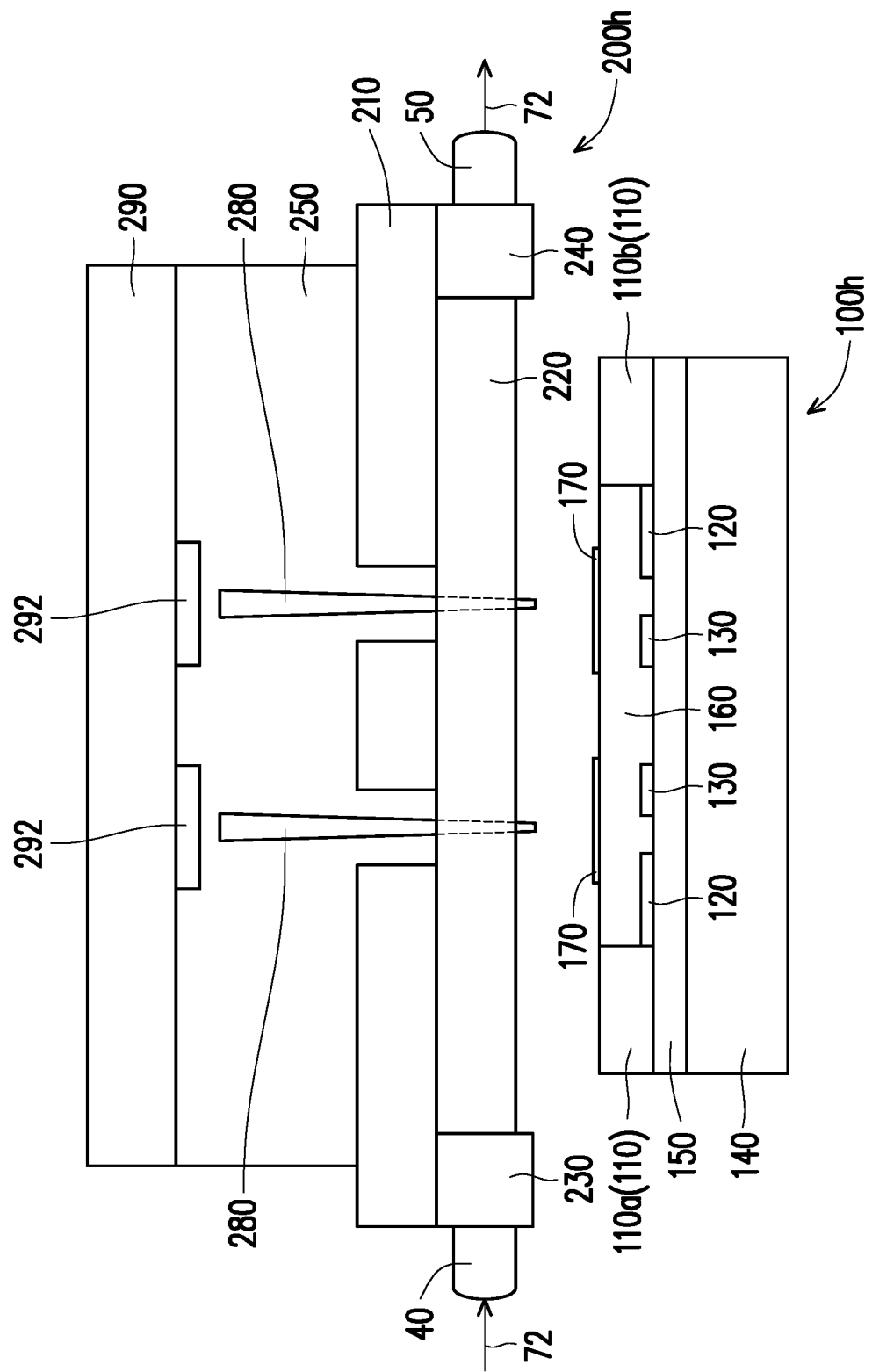
FIG. 15 is a sectional schematic view when an optical measurement apparatus has not yet measured a photonic integrated circuit according to another embodiment of the disclosure.
Figure 16:
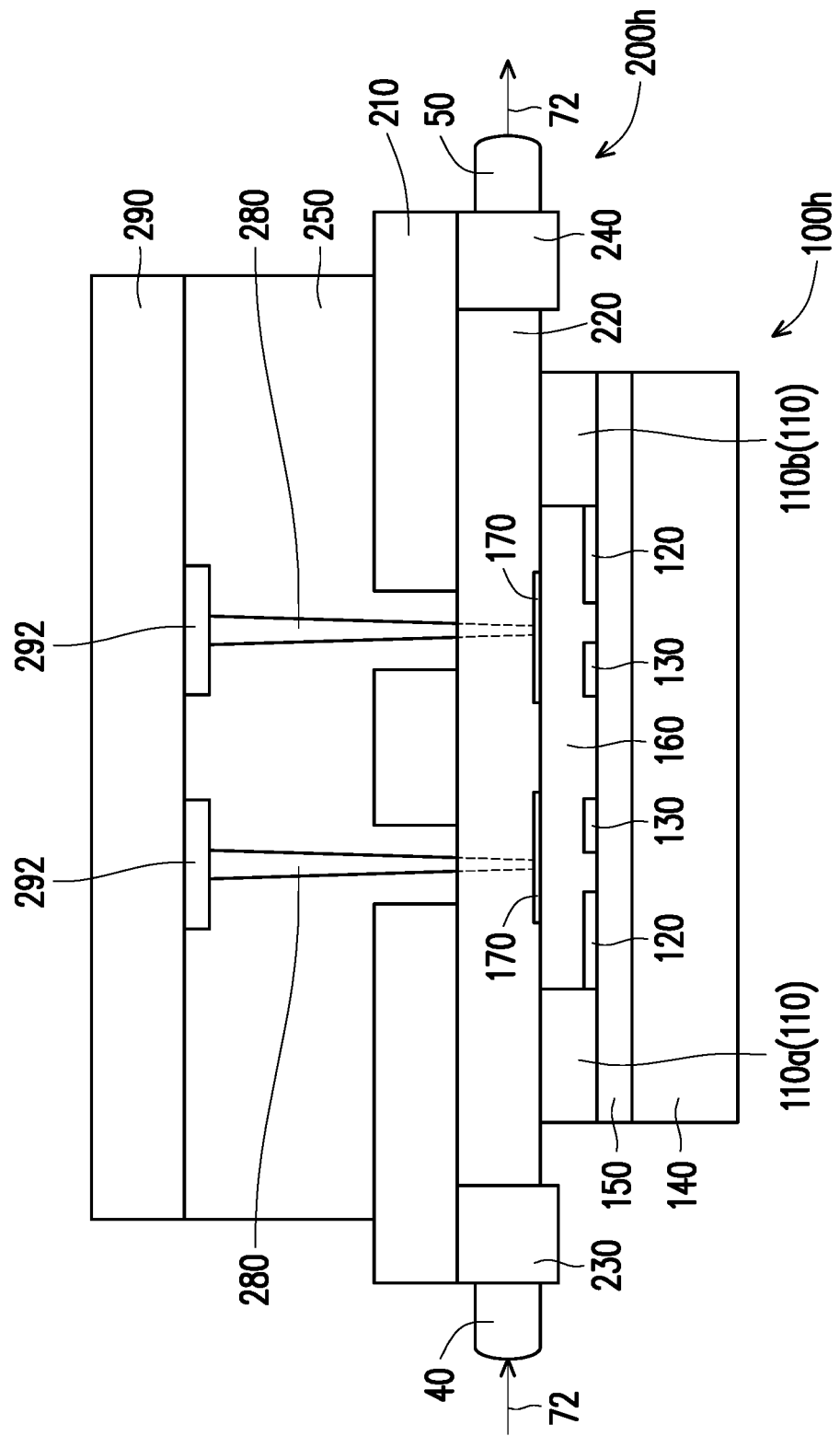
FIG. 16 is a sectional schematic view when the optical measurement apparatus in FIG. 15 is measuring the photonic IC.

FIG. 15 is a sectional schematic view when an optical measurement apparatus has not yet measured a photonic IC according to another embodiment of the disclosure; and FIG. 16 is a sectional schematic view when the optical measurement apparatus in FIG. 15 is measuring the photonic IC. Please refer to FIG. 15 and FIG. 16. An optical measurement apparatus 200h of the present embodiment is similar to the optical measurement apparatus 200 of FIG. 3A, and the differences between the two apparatuses are as follows. The optical measurement apparatus 200h of the present embodiment further includes a substrate 210, a holder 250 and a redistribution layer (RDL) 290, a plurality of first electrodes 292 and a plurality of electrical probes 280. The RDL 290 is, for example, disposed on the holder 250 on the substrate 210. The plurality of first electrodes 292 are disposed on the RDL 290. The plurality of electrical probes 280 penetrate through the substrate 210 and pass by the optical waveguide device 220, and a part of each electrical probe 280 is disposed on the holder 250. When the optical measurement apparatus 200h measures the photonic IC chip 100h, the electrical probes 280 connect the plurality of first electrodes 292 with a plurality of second electrodes 170 of the photonic IC chip 100h, respectively. The first electrodes 292 may be connected to an outer electrical signal source and an electrical detector by the RDL 290, and the second electrode 170 may be electrically connected to the device 130 of the inside of the photonic IC chip 100h. Thus, the electrical property of the photonic IC chip 100h may be detected by the electrical probes 280; and the optical measurement of the photonic IC chip 100h may be performed by the optical waveguide device 220.

Figure 17:
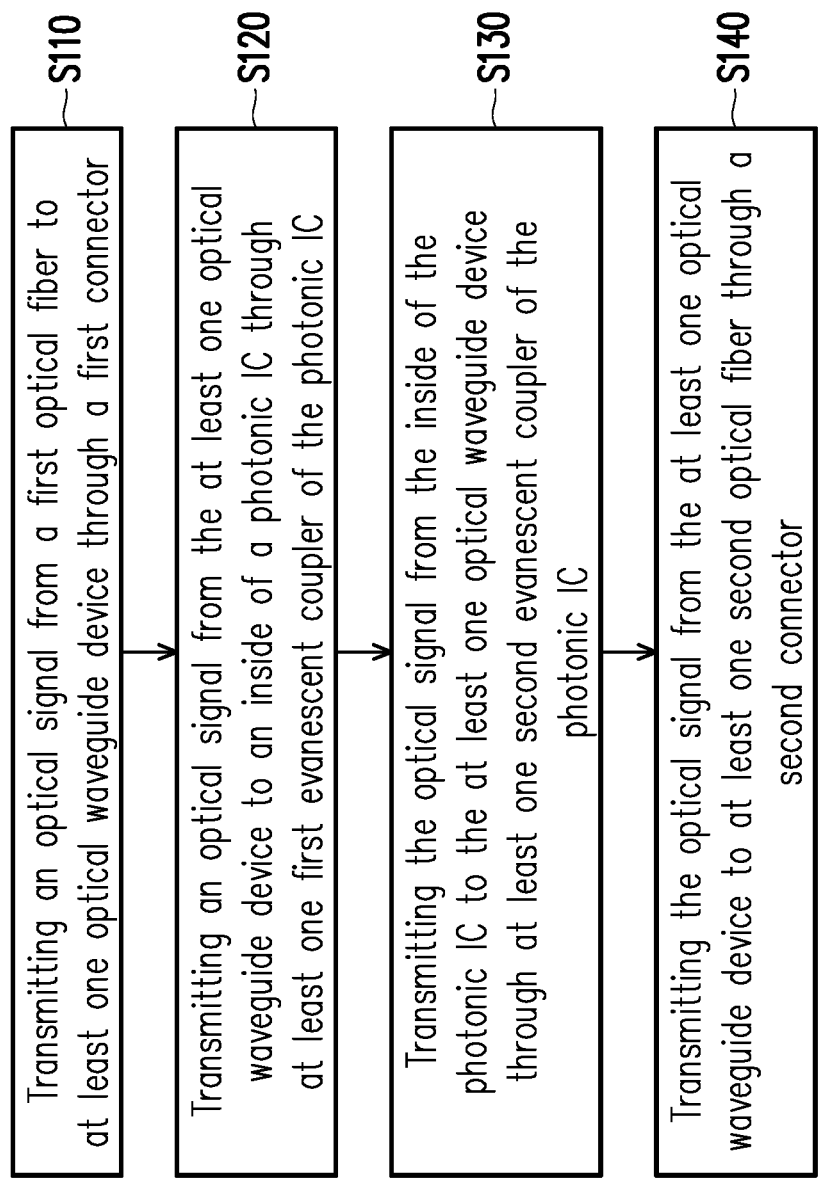
FIG. 17 is a process chart of an optical measurement method according to an embodiment of the disclosure.

FIG. 17 is a process chart of an optical measurement method according to an embodiment of the disclosure. The optical measurement method of the present embodiment may be performed by using the optical measurement apparatus of any embodiment mentioned above. The optical measurement apparatus 200 is used as an example for the following explanation. Please refer to FIG. 3B and FIG. 17. The optical measurement method of the present embodiment includes the following implemented steps. Firstly, step S110 is implemented to transmit an optical signal 72 from a first optical fiber 40 to at least one optical waveguide device 220 through a first connector 230; then, step S120 is implemented to transmit the optical signal 72 from the at least one optical waveguide device 220 to the inside of a photonic IC (a photonic IC chip 100, for example) through at least one first evanescent coupler 110a of the photonic IC; and then, step S130 is implemented to transmit the optical signal 72 from the inside of the photonic IC to the at least one optical waveguide device 220 through at least one second evanescent coupler 110b; afterward, step S140 is implemented to transmit the optical signal 72 from the at least one optical waveguide device 220 to at least one second optical fiber 50 through a second connector 240. In the present embodiment, the steps S110-S140 may be implemented naturally and in sequence along with the transmission of the optical signal 72 when the optical waveguide device 220 is closed to or contacts the first evanescent coupler 110a and the second evanescent coupler 110b when the measurement is being performed.

The optical measurement method of the present embodiment may achieve the advantages and effects of the optical measurement apparatuses of each embodiment mentioned above, and the details are not described again here.

In the embodiments of FIG. 1, FIG. 3A and FIG. 3B, when an optical measurement apparatus 200 is adopted to measure a photonic IC chip 100, an optical waveguide device 220 directly contacts a first evanescent coupler 110a and directly contacts a second evanescent coupler 110b. In the embodiment of FIG. 3B, a part of an optical signal 72 from a first connector 230 and transmitted in the optical waveguide device 220 is transmitted to a waveguide 120 (a silicon waveguide, for example) in the photonic IC chip 100 through the first evanescent coupler 110a. The optical signal 72 transmitted in the waveguide 120 is again further transmitted to the optical waveguide device 220 through the second evanescent coupler 110b. Besides, as shown in FIG. 3A, when the optical measurement apparatus 200 does not measure the photonic IC chip 100, the optical waveguide device 220 does not contact the first evanescent coupler 110a and the second evanescent coupler 110b; thus, the optical signal 72 from the first connector 230 is directly transmitted to the second evanescent coupler 110b through the optical waveguide device 220 and is output through a second optical fiber 50, the optical signal 72 obtained by which may be configured to calibrate the optical measurement apparatus 200. For example, an optical power meter 80 may be electrically connected to a processor 81, and the processor 81 may compare the optical signal 72 from the second optical fiber 50 detected by the optical power meter 80 when the photonic IC chip 100 is measured with that when the photonic IC 100 is not measured, so as to achieve the effect of calibrating the obtained optical signal 72 when measuring the photonic IC chip 100.

In an embodiment, the processor 81 is, for example, a central processing unit, (CPU), a microprocessor, a digital signal processor (DSP), a programmable controller, a programmable logic device (PLD) or other similar devices or combinations of the devices thereof, and the disclosure is not limited thereto. Besides, in an embodiment, each function of the processor 81 may be implemented as a plurality of program codes. The plurality of program codes may be stored in a memory and the plurality of program codes are executed by the processor 81. Or, in an embodiment, each function of the processor 81 may be implemented as one or a plurality of circuits. The disclosure does not limit whether to use the way of software or of hardware to implement each function of the processor 81.

Based on above, in the optical measurement apparatus and method of the present embodiment, since the optical waveguide device is adopted to be aligned with and contact the evanescent coupler on the photonic IC chip so as to perform the input and output of the optical signal, the layout of the evanescent couplers on the photonic IC chip is not limited by the size and measurement direction of the optical fiber. In other words, the layout of the optical waveguide device may be adjusted flexibly to serve as a bridge between the evanescent coupler and the optical fiber; therefore, the problem that the optical fiber cannot align with the diffraction grating easily in the known technology may not occur. Besides, by the flexible adjustment of the layout of the optical waveguide device, the array test may be achieved easily.

Besides, in the optical measurement apparatus and method of the present embodiment, an interval of the plurality of optical waveguide devices at the first connector and at the second connector is greater than an interval between neighbors of the plurality of first evanescent couplers and greater than an interval between neighbors of the plurality of second evanescent couplers. Therefore, the density and number of the evanescent couplers on the photonic IC chip may be more and may not be limited by the size of the optical fiber; also, the difficulty of optical fiber alignment issue may not occur.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An optical measurement device, configured to measure a photonic integrated circuit (photonic IC), the optical measurement device comprising:
    a substrate;
    at least one optical waveguide device disposed on the substrate; and
    a first connector and a second connector which are connected to the at least one optical waveguide device, wherein the at least one optical waveguide device comprises a first optical waveguide and a second optical waveguide separated from each other; the first optical waveguide is connected to the first connector and the second optical waveguide is connected to the second connector; an optical signal from a first optical fiber is sequentially transmitted to the first optical waveguide through the first connector, transmitted to an inside of the photonic IC through at least one first evanescent coupler of the photonic IC, transmitted to the second optical waveguide through at least one second evanescent coupler of the photonic IC, and transmitted to at least one second optical fiber through the second connector.

2. The optical measurement apparatus according to claim 1, wherein one end of the first optical waveguide closest to the first evanescent coupler is a tapered end, and one end of the second optical waveguide closest to the second evanescent coupler is a tapered end.

3. The optical measurement apparatus according to claim 1, further comprising a holder, wherein the substrate is disposed on the holder.

4. The optical measurement apparatus according to claim 1, further comprising a protective layer, covering surfaces of the first optical waveguide and the second optical waveguide.

5. The optical measurement apparatus according to claim 1, wherein the at least one optical waveguide device is a plurality of optical waveguide devices, and the at least one second optical fiber is a plurality of second optical fibers; optical signals in the plurality of optical waveguide devices are respectively transmitted to the plurality of second optical fibers through the second connector.

6. The optical measurement apparatus according to claim 1, wherein the at least one optical waveguide device is a plurality of optical waveguide devices; the at least one first evanescent coupler is a plurality of first evanescent couplers, and the at least one second evanescent coupler is a plurality of second evanescent couplers; an interval between the plurality of optical waveguide devices at the first connector and the second connector is greater that an interval between neighbors of the plurality of first evanescent couplers, and greater than an interval between neighbors of the plurality of second evanescent couplers.

7. The optical measurement apparatus according to claim 1, further comprising:
    a plurality of electrical probes, penetrating through the substrate and passing by the at least one optical waveguide device,
    wherein, when the optical measurement apparatus measures the photonic IC, the plurality of electrical probes are respectively connected to a plurality of electrodes of the photonic IC.

* * * * *